US012660700B2

(12) United States Patent
Chong et al.

(10) Patent No.: US 12,660,700 B2
(45) Date of Patent: Jun. 16, 2026

(54) SEMICONDUCTOR DEVICES HAVING ALIGNED FRONT-END INTERFACE CONTACTS AND BACK-END INTERFACE CONTACTS, AND ASSOCIATED SYSTEMS AND METHODS

(71) Applicant: Micron Technology, Inc., Boise, ID (US)

(72) Inventors: Chin Hui Chong, Singapore (SG); Hari Giduturi, Folsom, CA (US); Yeon-Chang Hahm, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 485 days.

(21) Appl. No.: 18/202,249

(22) Filed: May 25, 2023

(65) Prior Publication Data

US 2023/0395569 A1     Dec. 7, 2023

Related U.S. Application Data

(60) Provisional application No. 63/347,925, filed on Jun. 1, 2022.

(51) Int. Cl.
*H10W 90/00*          (2026.01)
*H10B 80/00*          (2026.01)
                      (Continued)

(52) U.S. Cl.
CPC ............ *H10W 90/00* (2026.01); *H10B 80/00* (2023.02); *H10W 20/43* (2026.01); *H10W 72/07552* (2026.01); *H10W 72/527* (2026.01); *H10W 72/926* (2026.01); *H10W 72/9415* (2026.01); *H10W 80/721* (2026.01); *H10W*

*80/743* (2026.01); *H10W 90/24* (2026.01); *H10W 90/752* (2026.01); *H10W 90/754* (2026.01)

(58) Field of Classification Search
CPC ... H01L 25/0657; H01L 23/528; H01L 24/08; H01L 24/09; H01L 24/48; H01L 24/49; H01L 2224/08112; H01L 2224/0903; H01L 2224/48145; H01L 2224/48227; H01L 2224/4903; H01L 2225/06506; H01L 2225/0651; H01L 2225/06562; H01L 2924/1431; H01L 2924/1436; H01L 2924/1437; H01L 2924/1438; H01L 2924/14511; H10B 80/00; H10W 90/00; H10W 90/754; H10W 90/752; H10W 90/24; H10W 20/43; H10W 72/527; H10W 72/07552; H10W 72/926; H10W 72/9415; H10W 80/721; H10W 80/743
See application file for complete search history.

(56) References Cited

U.S. PATENT DOCUMENTS

2011/0084374 A1 *  4/2011  Chen ...................... H01L 24/06
                                                      257/690

* cited by examiner

*Primary Examiner* — Timor Karimy
(74) *Attorney, Agent, or Firm* — Dorsey & Whitney LLP

(57) ABSTRACT

Semiconductor devices, such as memory devices, and associated systems and methods, are disclosed herein. A representative memory device includes a substrate including circuitry, back-end contacts electrically coupled to the circuitry, and front-end contacts. The front-end contacts are configured to receive electrical signals from an external device via a front-end interface. Individual ones of the front-end contacts are electrically coupled to and aligned along an axis with corresponding ones of the back-end contacts.

19 Claims, 6 Drawing Sheets

(51)  Int. Cl.

| | |
|---|---|
| *H10W 20/43* | (2026.01) |
| *H10W 72/50* | (2026.01) |
| *H10W 72/90* | (2026.01) |
| *H10W 80/00* | (2026.01) |
| *H10W 90/24* | (2026.01) |
| *H10W 72/00* | (2026.01) |

560

SEMICONDUCTOR DEVICES HAVING ALIGNED FRONT-END INTERFACE CONTACTS AND BACK-END INTERFACE CONTACTS, AND ASSOCIATED SYSTEMS AND METHODS

CROSS-REFERENCE TO RELATED APPLICATION(S)

The present application claims priority to U.S. Provisional Patent Application No. 63/347,925, filed Jun. 1, 2022, the disclosure of which is incorporated herein by reference in its entirety.

TECHNICAL FIELD

The present disclosure generally relates to semiconductor devices, such as memory devices, including memory dies having aligned front end interface contacts and back-end interface contacts for improved wire bonding and signaling performance.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory packages and/or components of the memory devices, among other metrics.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
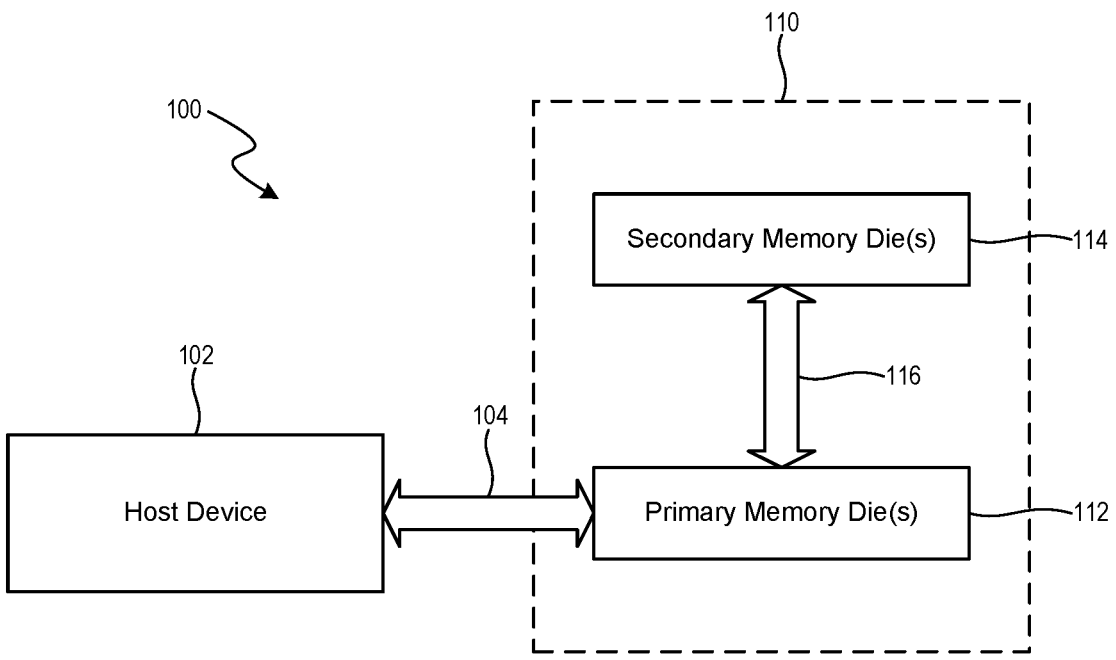
FIG. 1 is a schematic view of a memory system in accordance with embodiments of the present technology.

Embodiments of the present technology are directed to semiconductor devices, such as memory devices, and associated systems and methods. In several of the embodiments described below, a representative memory device includes a package substrate, a primary memory die, and a secondary memory die stacked on the primary memory die. The primary memory die and the secondary memory die each comprise a substrate including circuitry, first back-end contacts electrically coupled to the circuitry, second back-end contacts electrically coupled to the circuitry, first front-end contacts, and second front end contacts. Individual ones of the first front-end contacts are electrically coupled to and aligned along an axis with corresponding ones of the first back-end contacts, and individual ones of the second front-end contacts are electrically coupled to corresponding ones of the second back-end contacts.

The memory device further includes first bond wires bonded to the first front-end contacts the primary memory die, second bond wires bonded to the second front-end contacts of the primary memory die, and third bond wires bonded to and extending between the second back-end contacts of the primary memory die and the secondary memory die. The first bond wires are configured to receive power and/or ground signals from an external device via a front-end interface. The second bond wires are configured to receive data signals from the external device via the front-end interface. In some aspects of the present technology, aligning the first front-end contacts and the first back-end contacts of each memory die can help reduce shorting between the first, second, and/or third bond wires and/or improve the signal integrity of the memory device.

Numerous specific details are discussed to provide a thorough and enabling description of embodiments of the present technology. A person skilled in the art, however, will understand that the technology may have additional embodiments and that the technology may be practiced without several of the details of the embodiments described below with reference to FIGS. 1-5. In other instances, well-known structures or operations often associated with semiconductor devices, memory devices, etc., are not shown, or are not described in detail, to avoid obscuring other aspects of the technology. In general, it should be understood that various other devices and systems in addition to those specific embodiments disclosed herein may be within the scope of the present technology.

As used herein, the terms "vertical," "lateral," "upper," "lower," "above," "below," and the like can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 is a schematic view of a memory system 100 in accordance with embodiments of the present technology. In the illustrated embodiment, the memory system 100 includes a host device 102 coupled to a packaged memory device 110 (e.g., a semiconductor device) via a front-end interface 104. The host device 102 can comprise a memory controller or a central processing unit (CPU) of a device external to the memory device 110. The memory device 110 can include a plurality of memory dies (e.g., semiconductor dies), such as one or more primary memory dies 112 and one or more secondary memory dies 114. In some embodiments, the memory device 110 includes one primary memory die 112 and a plurality of the secondary memory dies 114 arranged in a stack on the primary memory die 112. In some embodiments, the primary memory die 112 and the secondary memory dies 114 are identical but are electrically connected differently within the memory device 110, as described in greater detail below with reference to FIGS. 2-4.

In the illustrated embodiment, the primary memory die 112 is coupled to the secondary memory die 114 via a back-end interface 116. The back-end interface 116 provides for internal communication between the primary memory die 112 and the secondary memory dies 114 within the memory device 110. The front-end interface 104 and the back-end interface 116 can each define a plurality of signal paths and can comprise one or more signal buses. In some embodiments, the back-end interface 116 is decoupled from the front-end interface 104. In some embodiments, one or more signal paths can be provided in common or shared between the front-end interface 104 and the back-end interface 116. In some embodiments, the front-end interface 104 and/or the back-end interface 116 comprise multiple parallel data paths that can be directional or bidirectional. For example, the back-end interface 116 can include a first data path (e.g., comprising multiple parallel bit channels) designated for communications from the primary memory die 112 to the secondary memory dies 114, and a second data path (e.g., comprising multiple parallel bit channels) designated for communications from some or all of the secondary memory dies 114 to the primary memory die 112. In some embodiments, usage of or access to the second data path portion of the back-end interface 116 can be specified by the primary memory die 112 in a time-multiplexed manner to avoid data collisions. The same or similar configuration can be used for the front-end interface 104 to facilitate communication between one or more of the primary memory dies 112 and one or more of the host devices 102.

Figure 2:
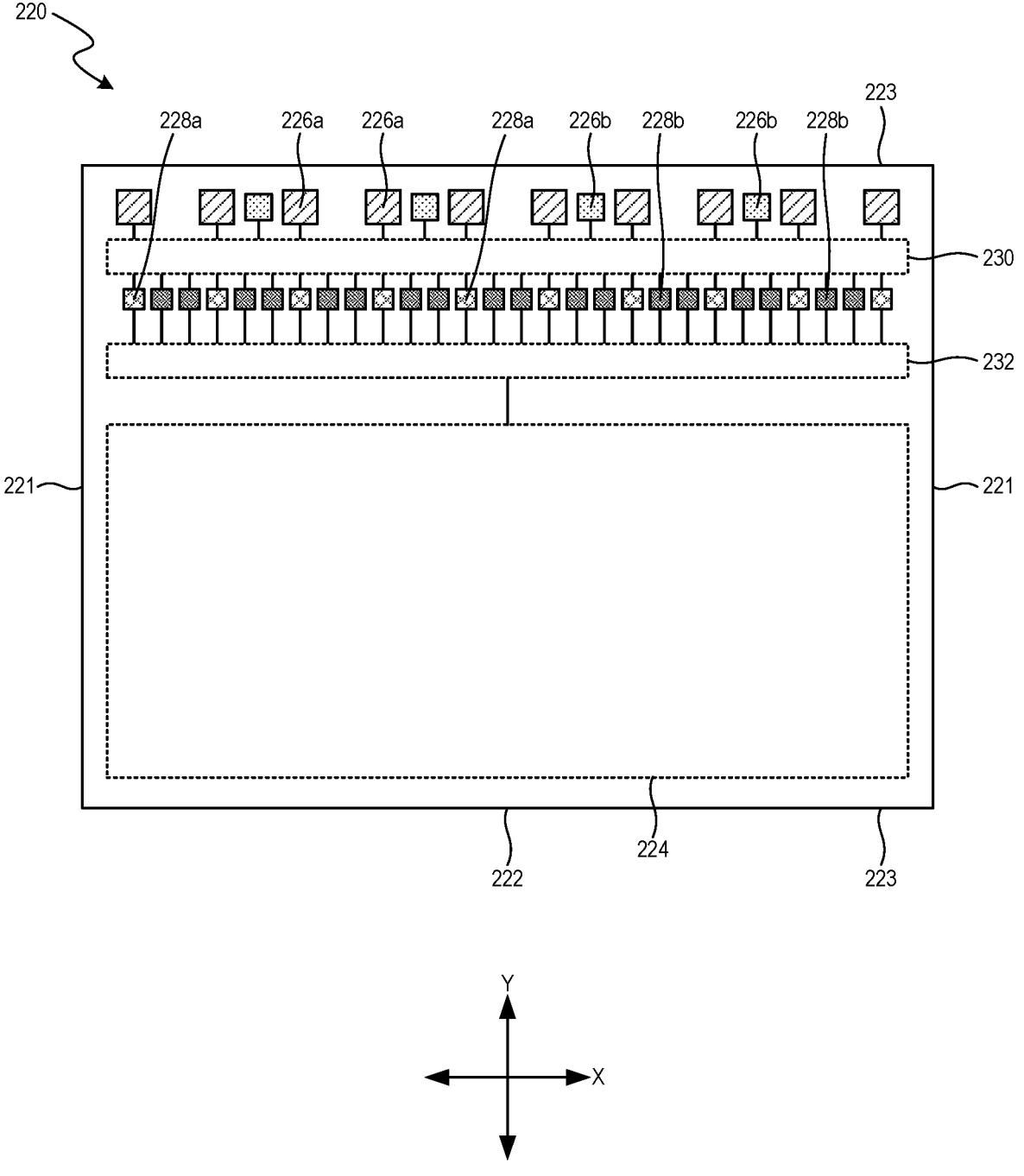
FIG. 2 is a partially-schematic top view of a memory die in accordance with embodiments of the present technology.

FIG. 2 is a partially-schematic top view of a memory die 220 in accordance with embodiments of the present technology. The memory die 220 can be a memory die of the memory device 110 of FIG. 1, such as the primary memory die 112 and/or one of the secondary memory dies 114. The memory die 220 can include a substrate 222 (e.g., a silicon substrate) including circuitry 224. The circuitry can include integrated memory circuitry and/or logic circuitry, which can include various types of semiconductor components and functional features, such as dynamic random-access memory (DRAM), static random-access memory (SRAM), flash memory (e.g., NAND and/or NOR), other forms of integrated circuit memory, processing circuits, and/or other semiconductor features.

In the illustrated embodiment, the memory die 220 includes (i) a plurality of front-end contacts 226 (e.g., conductive pads; including individually identified first front-end contacts 226a and second front-end contacts 226b) and (ii) a plurality of back-end contacts 228 (e.g., conductive pads; including individually identified first back-end contacts 228a and second back-end contacts 228b). The front-end contacts 226 and the back-end contacts 228 can be formed of suitable electrically conductive materials.

The front-end contacts 226 are configured to receive and/or transmit signals from an external device, such as the host device 102 of FIG. 1. For example, the front-end contacts 226 can be electrically coupled to the front-end interface 104 of FIG. 1. In some embodiments, the front-end contacts 226 are configured to receive power, ground, and/or data signals from the external device. For example, the first front-end contacts 226a can receive power and/or ground signals and the second front-end contacts 226b can receive data signals. In the illustrated embodiment, the front-end contacts 226 are arranged in a row extending between (e.g., extending generally orthogonally between) opposing first edges 221 of the substrate 222 along an axis X of the memory die 220. The number, size, arrangement, spacing, etc., of the front-end contacts 226 is illustrative and, in other embodiments, the number, size, spacing, arrangement, etc., of the front-end contacts 226 can be different (e.g., including a different number of the first front-end contacts 226a and/or the second front-end contacts 226b).

The back-end contacts 228 are configured to receive and/or transmit signals internally from the memory die 220 to other memory dies (e.g., other ones of the memory dies 220) within a memory device including the memory die 220. For example, the back-end contacts 228 can be electrically coupled to the back-end interface 116 of FIG. 1. In the illustrated embodiment, the back-end contacts 228 are arranged in a row extending between (e.g., extending generally orthogonally between) opposing second edges 223 of the substrate 222 along an axis Y of the memory die 220. The number, size, arrangement, spacing, etc., of the back-end contacts 228 is illustrative and, in other embodiments, the number, size, spacing, arrangement, etc., of the back-end contacts 228 can be different (e.g., including a different number of the first back-end contacts 228a and/or the second back-end contacts 228b).

In the illustrated embodiment, the memory die 220 includes (i) a first redistribution structure 230 electrically coupling the front-end contacts 226 to the back-end contacts 228 and (ii) a second redistribution structure 232 electrically coupling the back-end contacts 228 to the circuitry 224. The first and second redistribution structures 230, 232 can be redistribution layers (RDLs), inline redistribution layers (iRDLs), and/or other wiring structures and can be separate structures or portions of the same structure. In some embodiments, the first redistribution structure 230 electrically couples individual ones of the front-end contacts 226 to corresponding individual ones of the back-end contacts 228. For example, the first redistribution structure 230 can electrically couple (i) the first front-end contacts 226a to corresponding ones of the first back-end contacts 228a and/or (ii) the second front-end contacts 226b to corresponding ones of the second back-end contacts 228b. In some embodiments, one or more of the back-end contacts 228 can be electrically decoupled from the first redistribution structure 230 and/or the first redistribution structure 230 can directly electrically couple one or more of the front-end contacts 226 to the circuitry 224 (e.g., bypassing the back-end contacts 228).

In the illustrated embodiment, the first front-end contacts 226a are at least generally (e.g., within 10%) aligned with the corresponding ones of the first back-end contacts 228a along the axis Y of the memory die 220. That is, for example, the first front-end contacts 226a that receive power and/or ground signals from the external device are aligned with corresponding ones of the first back-end contacts 228a that receive the same power and/or ground signals via the first redistribution structure 230. In some embodiments, some or all of the second front-end contacts 226b are misaligned with the corresponding ones of the second back-end contacts 228b along the axis Y. As described in greater detail below with reference to FIGS. 3A-4, in some aspects of the present technology such alignment of the first front-end contacts 226a and the first back-end contacts 228a can improve signal integrity and inhibit wire shorting when the memory die 220 is incorporated into a packaged memory device, such as the memory device 110 of FIG. 1.

Figure 3A:
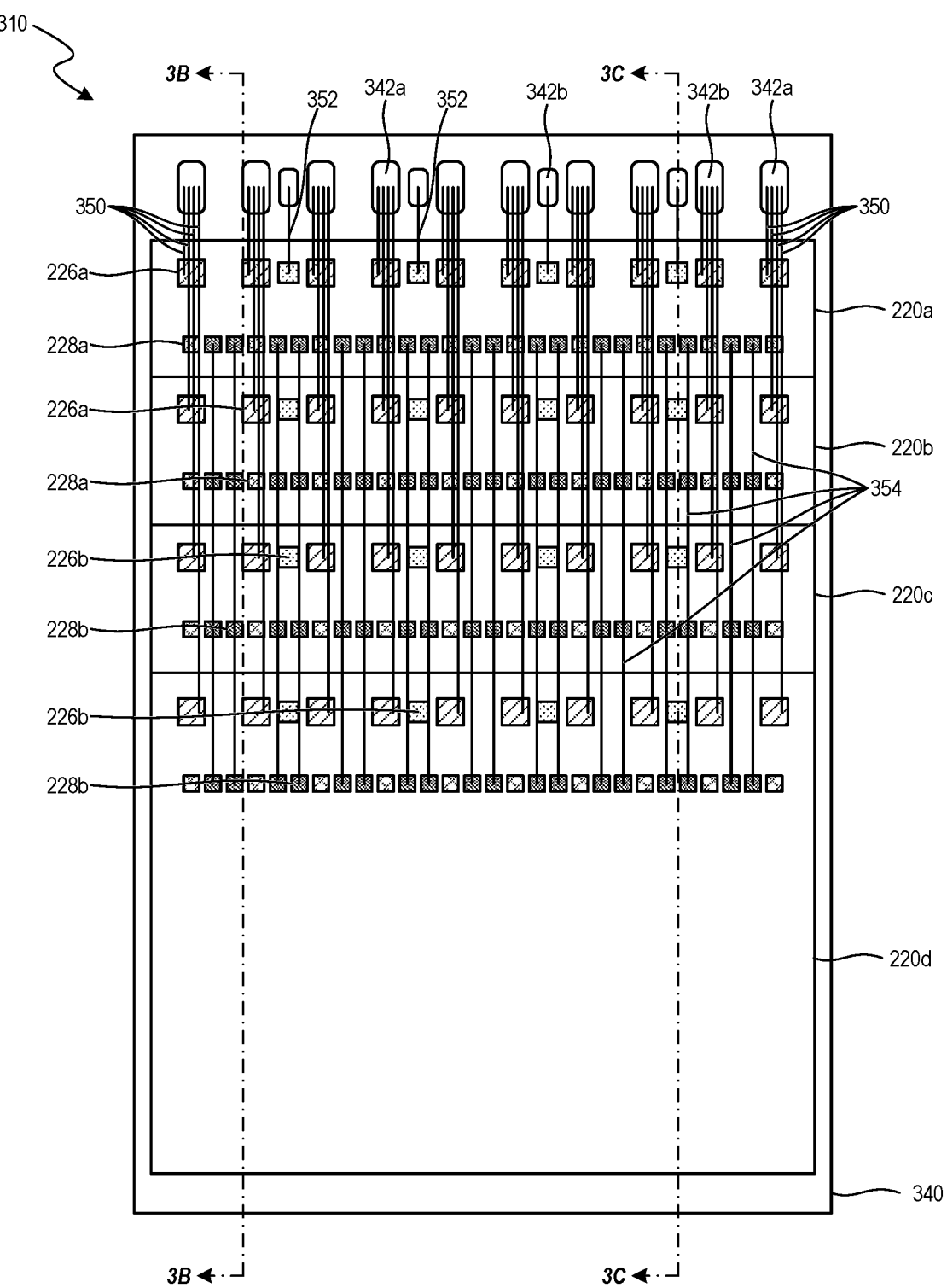
FIG. 3A is a top view of a memory device in accordance with embodiments of the present technology.
Figure 3B:
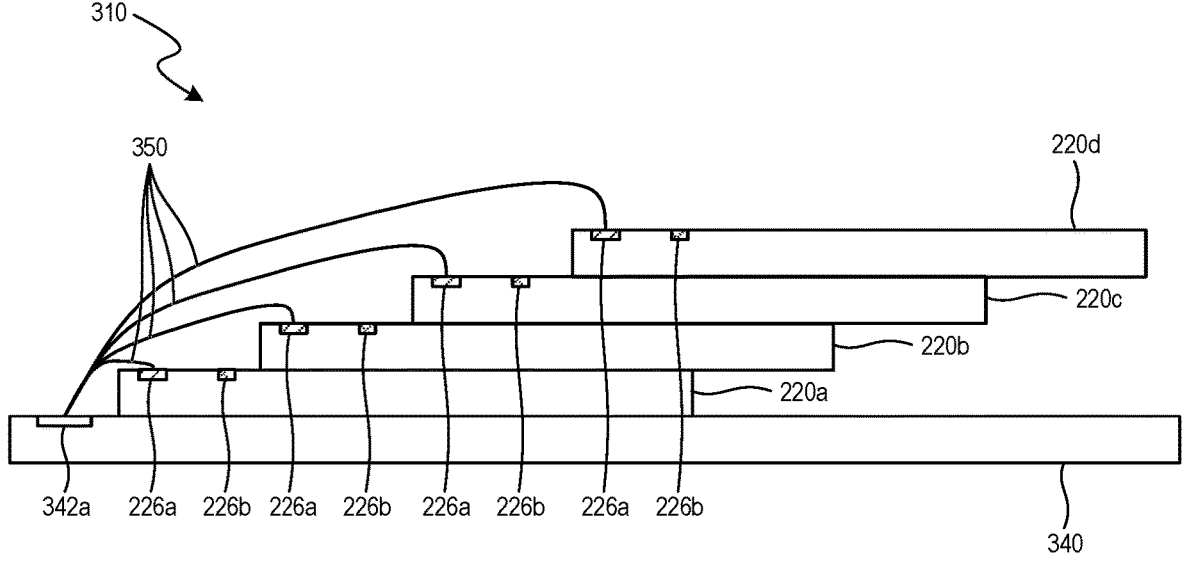
FIG. 3B is a side cross-sectional view of the memory device of FIG. 3A taken along the line 3B-3B in FIG. 3A in accordance with embodiments of the present technology.
Figure 3C:
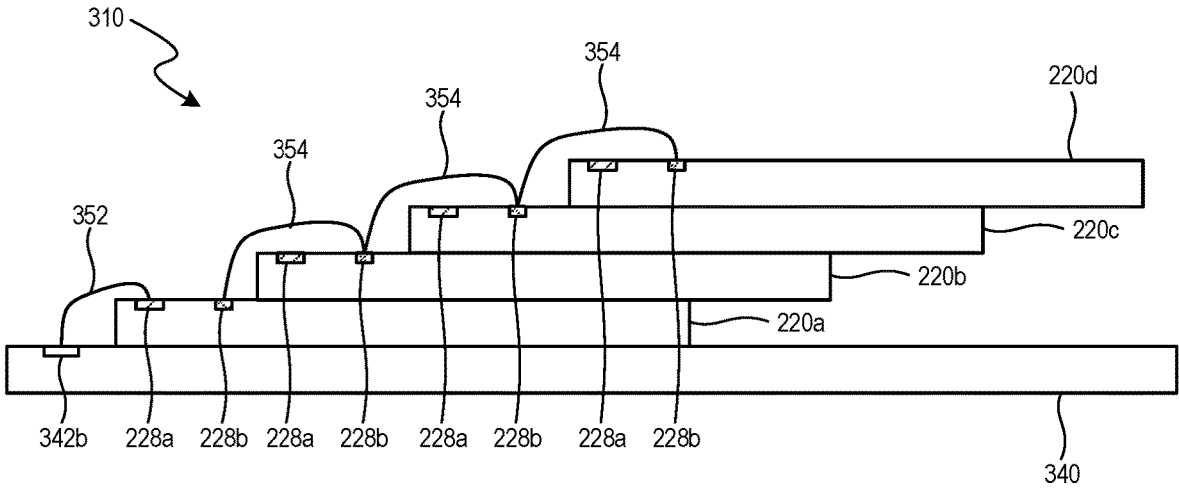
FIG. 3C is a side cross-sectional view of the memory device of FIG. 3A taken along the line 3C-3C in FIG. 3A in accordance with embodiments of the present technology.

FIG. 3A, for example, is a top view of a memory device 310 in accordance with embodiments of the present technology. FIG. 3B is a side cross-sectional view of the memory device 310 taken along the line 3B-3B in FIG. 3A in accordance with embodiments of the present technology. FIG. 3C is a side cross-sectional view of the memory device 310 taken along the line 3C-3C in FIG. 3A in accordance with embodiments of the present technology. The memory device 310 can be used in the memory system 100 of FIG. 1 to communicate with the host device 102 via the front-end interface 106.

Referring first to FIGS. 3A-3C together, the memory device 310 includes a package substrate 340 and a plurality of the memory dies 220 of FIG. 2 (identified individually as first through fourth memory dies 220a-d, respectively) carried by the package substrate 340. The package substrate 340 can be a printed circuit board (PCB), an interposer, a dielectric spacer, a semiconductor die (e.g., a logic die), and/or or the like. In the illustrated embodiment, the package substrate 340 includes a plurality of package contacts 342 (including individually identified first package contacts 342a and second package contacts 342b). The package contacts 342 can be bond fingers, bond pads, and/or the like. The first package contacts 342a can receive power and/or ground signals and the second package contacts 342b can receive data signals. In some embodiments, an underside of the package substrate 340 can be connected to electrical connectors (e.g., solder balls) configured to electrically couple the memory device 310 to external circuitry, such as the host device 102 and the front-end interface 106 of FIG. 1. The package substrate 340 can further include electrical lines, traces, and/or the like extending therethrough and/or thereacross that electrically connect the package contacts 342 to the electrical connectors and external circuitry.

In the illustrated embodiment, the memory dies 220 are arranged in a stack with (i) the first memory die 220a positioned on and coupled to the package substrate 340, (ii) the second memory die 220b positioned on and coupled to the first memory die 220a, (iii) the third memory die 220c positioned on and coupled to the second memory die 220b, and (iv) the fourth memory die 220d positioned on and coupled to the third memory die 220c. In some embodiments, the memory dies 220 can be laterally offset from one another (e.g., along the axis Y of FIG. 2) such that the front-end contacts 226 and the back-end contacts 228 of the memory dies 220 are exposed from the stack (e.g., at open portion or porch of each of the memory dies 220). Although four memory dies 220 are shown in FIGS. 3A-3C, the memory device 310 can include any number of the memory dies 220 (e.g., one, two, three, or more than three of the memory dies 220) arranged in such a stack. In other embodiments, the package substrate 340 and/or the memory dies 220 can be arranged/stacked differently, can have different shapes and/or dimensions, and so on.

Referring to FIGS. 3A and 3B together, the memory device 310 includes first bond wires 350 extending between and electrically coupling the first package contacts 342a to corresponding ones of the first front-end contacts 226a of the memory dies 220. That is, each of the first front-end contacts 226a of the memory dies 220 can be directly coupled to a corresponding one of the first package contacts 342a of the package substrate 340 via a corresponding one of the bond wires 350. Accordingly, in some embodiments the first back-end contacts 228a of the memory dies 220 need not be attached to bond wires (e.g., extending between the memory dies 220) as the electrical signals from the first package contacts 342a (e.g., power and/or ground signals) are directly provided to the memory dies 220 via the first front-end contacts 226a and the first bond wires 350.

Referring to FIGS. 3A and 3C together, the memory device 310 further includes (i) second bond wires 352 extending between and electrically coupling the second package contacts 342b to corresponding ones of the second front-end contacts 226b of the first memory die 220a and (ii) third bond wires 354 extending between and electrically coupling the second back-end contacts 228b of adjacent ones (e.g., adjacent pairs) of the memory dies 220 in the stack. That is, each of the second front-end contacts 226b of the first memory die 220a can be directly coupled to a corresponding one of the second package contacts 342b via a corresponding one of the second bond wires 352, and the corresponding second back-end contacts 228b of the memory dies 220 can be coupled to together via the third bond wires 354 in a cascade or daisy-chain configuration (e.g., with the second back-end contacts 228b of the first memory die 220a coupled to the second back-end contacts 228b of the second memory die 220b, the second back-end contacts 228b of the second memory die 220b coupled to the second back-end contacts 228b of the third memory die 220c, and so on). In this manner, each of the memory dies 220 is coupled to the second package contacts 342b of the package substrate 340.

Referring to FIGS. 3A-3C together, the memory device 310 can include a molded material (not shown) over the package substrate 340. The molded material can at least partially surround the memory dies 220, the first bond wires 350, the second bond wires 352, the third bond wires 354, and/or additional components of the semiconductor memory device 310 to protect one or more of these components from contaminants and/or physical damage. For example, the molded material can encapsulate (e.g., seal) the components of the memory device 310. In some embodiments, the memory device 310 includes additional passive or active electrical components (e.g., capacitors) supported by and/or electrically coupled to the package substrate 340.

Referring to FIGS. 1 and 3A-3C together, in some embodiments the first memory die 220a is configured as a primary memory die and the second through fourth memory dies 220b-d are configured as secondary memory dies. The primary memory die 220a communicates with the front-end interface 104 to receive/transmit signals (e.g., data signals) from/to the host device 102 over the second package contacts 342b, and the second bond wires 352 and the third bond wires 354 extend the front-end interface 104 to the secondary memory dies 220b-d. In some aspects of the present technology, each of the memory dies 220 is directly coupled to the front-end interface 104 over the first package contacts 342a via the first bond wires 350 for, for example, receiving power and/or ground signals. Directly coupling the memory dies 220 to the front-end interface 104 over the first package contacts 342a in this manner can ensure that each of the memory dies 220 receives a sufficient power supply.

Referring to FIGS. 1-3C together, in some aspects of the present technology aligning the first front-end contacts 226a and the first back-end contacts 228a of each memory die 220 can help reduce shorting between the bond wires 350-354 and/or improve the signal integrity of the memory device 310. For example, because the first front-end contacts 226a are directly coupled to the first bond wires 350, the first bond wires 350 can extend generally over and in the space above the open first back-end contacts 228a that need not be attached to bond wires. In contrast, if the first front-end contacts 226a and the first back-end contacts 228a were misaligned (e.g., along the axis Y in FIG. 2), the first bond wires 350 could fan out, contact, and/or short one or more of the second bond wires 352 and/or the third bond wires 354—especially as the number of the memory dies 220 in the stack increases and/or especially for the first bond wires 350 extending to the memory dies 220 positioned toward the top of the stack (e.g., the fourth memory die 220d). That is, aligning the first front-end contacts 226a and the first back-end contacts 228a can reduce the likelihood of any of the bond wires 350-354 crossing by allowing each of the first bond wires 350 to extend generally parallel to the axis Y.

Additionally, aligning the first front-end contacts 226a and the first back-end contacts 228a can reduce the total length of the first bond wires 350 as each of the first bond wires 350 extends generally parallel to the axis Y—rather than at an angle to the axis Y—for a same total distance along the axis Y between the first package contacts 342a and the first front-end contacts 226a. Reducing the length of the first bond wires 350 can reduce the inductance and signal loss along the first bond wires 350.

Figure 4:
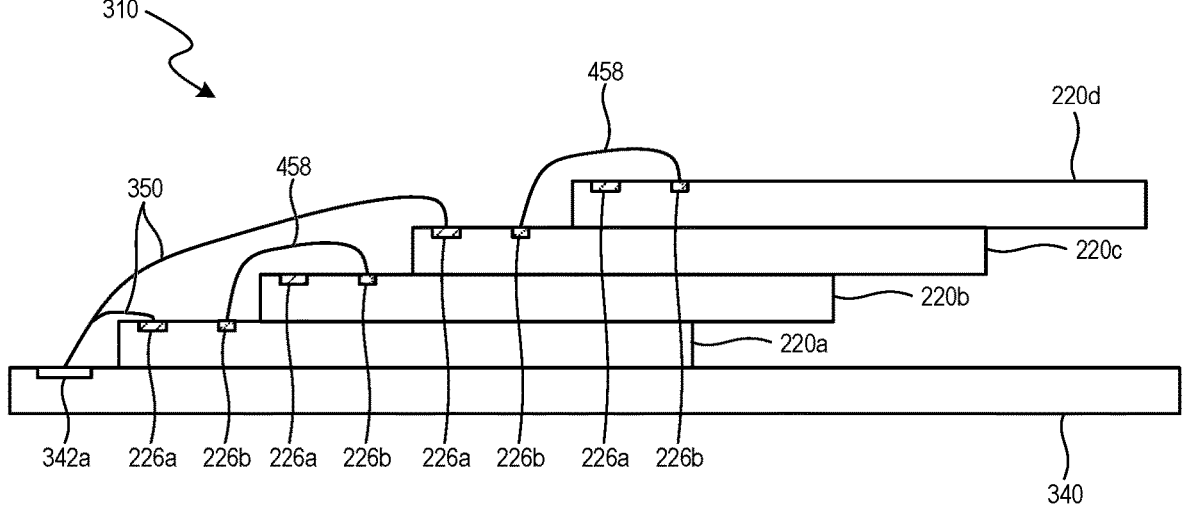
FIG. 4 is a side cross-sectional view of the memory device of FIG. 3A taken along the line 3B-3B in FIG. 3A in accordance with additional embodiments of the present technology.

In some embodiments, not all of the first front-end contacts 226a of the memory dies 220 are directly coupled to corresponding ones of the first package contacts 342a via the first bond wires 350. FIG. 4, for example, is a side cross-sectional view of the memory device 310 taken along the line 3B-3B in FIG. 3A in accordance with additional embodiments of the present technology. In the illustrated embodiment, the first bond wires 350 only extend between and electrically couple the first package contacts 342a to corresponding ones of the first front-end contacts 226a of the first and third memory dies 220a, c. The memory device 310 can further include fourth bond wires 458 extending between and electrically coupling (i) the second front-end contacts 226b of the first and second memory dies 220a, b and (ii) the second front-end contacts 226b of the third and fourth memory dies 220c, d.

Accordingly, the first bond wires 350 can provide power, ground, and/or other signals to the first and third memory dies 220a, c, which in turn transmit the signals to the second and fourth memory dies 220b, d, respectively, via the fourth bond wires 458. In other embodiments, more, fewer, or a different arrangement of the memory dies 220 can be directly coupled to the first package contacts 342a via the first bond wires 350, and the fourth bond wires 458 can be used to electrically couple the second back-end contacts 228b of the memory dies 220 that are not directly coupled to the first package contacts 342a to extend the front-end interface throughout the stack of the memory dies 220.

Figure 5:
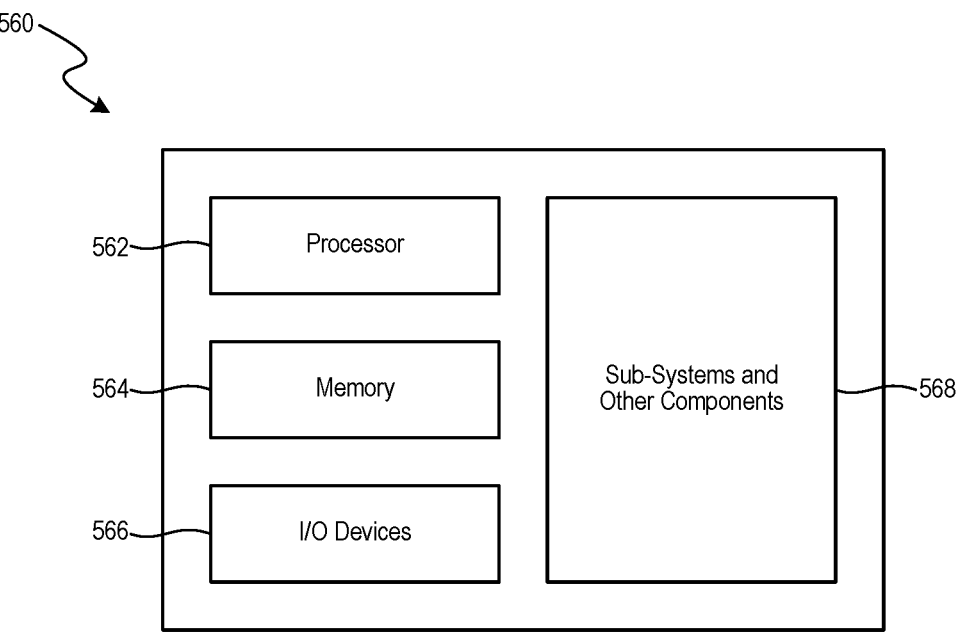
FIG. 5 is a schematic view of a system that includes a memory device in accordance with embodiments of the present technology.

The memory devices described in detail above with reference to FIGS. 1-4 and/or packages incorporating the memory device can be incorporated into any of a myriad of larger and/or more complex systems, a representative example of which is system 560 shown schematically in FIG. 5. The system 560 can include a processor 562, a memory 564 (e.g., SRAM, DRAM, NAND, flash, and/or other memory devices), input/output devices 566, and/or other subsystems or components 568. The memory devices and/or packages described above with reference to FIGS. 1-4 can be included in any of the elements shown in FIG. 5. The resulting system 560 can be configured to perform any of a wide variety of suitable computing, processing, storage, sensing, imaging, and/or other functions. Accordingly, representative examples of the system 560 include, without limitation, computers and/or other data processors, such as desktop computers, laptop computers, Internet appliances, hand-held devices (e.g., palm-top computers, wearable computers, cellular or mobile phones, personal digital assistants, music players, and so on), tablets, multi-processor systems, processor-based or programmable consumer electronics, network computers, and minicomputers. Additional representative examples of the system 560 include lights, cameras, vehicles, etc. With regard to these and other example, the system 560 can be housed in a single unit or distributed over multiple interconnected units, for example, through a communication network. The components of the system 560 can accordingly include local and/or remote memory storage devices and any of a wide variety of suitable computer-readable media.

The following examples are illustrative of several embodiments of the present technology:

1. A semiconductor device, comprising:
   a substrate having multiple conductive first contacts, wherein the first contacts extend sequentially along an axis of the semiconductor device, and wherein adjacent pairs of the first contacts are staggered relative to the axis;
   a semiconductor die coupled to the substrate and having multiple conductive second contacts; and
   multiple wire bonds electrically coupling individual ones of the first contacts to corresponding ones of the second contacts.

20. The semiconductor device of example 19 wherein the second contacts extend sequentially along the axis of the semiconductor device, wherein adjacent pairs of the second contacts are staggered relative to the axis, wherein the third contacts extend sequentially along the axis, and wherein adjacent pairs of the third contacts are staggered relative to the axis.

The above detailed description of embodiments of the present technology are not intended to be exhaustive or to limit the technology to the precise forms disclosed above. Although specific embodiments of, and examples for, the technology are described above for illustrative purposes, various equivalent modifications are possible within the scope of the technology as those skilled in the relevant art will recognize. For example, although steps are presented in a given order, other embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively.

As used herein, the phrase "and/or" as in "A and/or B" refers to A alone, B alone, and A and B. To the extent any materials incorporated herein by reference conflict with the present disclosure, the present disclosure controls. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the technology. Further, while advantages associated with some embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A memory die, comprising:
a substrate including circuitry;
back-end contacts electrically coupled to the circuitry;
front-end contacts configured to receive electrical signals from an external device via a front-end interface, wherein individual ones of the front-end contacts are electrically coupled to and aligned along an axis with corresponding ones of the back-end contacts;
a first redistribution structure electrically coupling the front-end contacts to the corresponding ones of the back-end contacts; and
a second redistribution structure electrically coupling the back-end contacts to the circuitry.

2. The memory die of claim 1 wherein the electrical signals are power and/or ground signals.

3. The memory die of claim 1 wherein the front-end contacts extend in a first row, wherein the back-end contacts extend in a second row, and wherein the axis is orthogonal to the first and second rows.

4. The memory die of claim 1 wherein at least one of the back-end contacts is electrically decoupled from the front-end contacts.

5. The memory die of claim 1 wherein the front-end contacts are first front-end contacts, and further comprising second front-end contacts electrically coupled to corresponding ones of the back-end contacts.

6. The memory die of claim 5 wherein the first front-end contacts are configured to receive power and/or ground signals, and wherein the second front-end contacts are configured to receive data signals.

7. The memory die of claim 5 wherein the second front-end contacts are at least partially unaligned with the corresponding ones of the back-end contacts along the axis.

8. A memory device, comprising:
a plurality of memory dies arranged in a stack, wherein each of the memory dies comprises—
a substrate including circuitry;
first back-end contacts electrically coupled to the circuitry;
second back-end contacts electrically coupled to the circuitry;
first front-end contacts, wherein individual ones of the first front-end contacts are electrically coupled to and aligned along an axis with corresponding ones of the first back-end contacts; and
second front-end contacts, wherein individual ones of the second front-end contacts are electrically coupled to corresponding ones of the second back-end contacts; and
first bond wires bonded to the first front-end contacts of at least one of the memory dies, wherein the first bond wires are configured to receive first electrical signals from an external device via a front-end interface;
second bond wires bonded to the second front-end contacts of at least one of the memory dies, wherein the second bond wires are configured to receive second electrical signals from the external device via the front-end interface; and
third bond wires bonded to and extending between the second back-end contacts of adjacent ones of the memory dies in the stack.

9. The memory device of claim 8 wherein the first electrical signals are power and/or ground signals.

10. The memory device of claim 8 wherein the second electrical signals are data signals.

11. The memory device of claim 8 wherein the first bond wires are bonded only to the first front-end contacts of a lowermost one of the memory dies in the stack.

12. The memory device of claim 8 wherein the second bond wires are bonded only to the second front-end contacts of a lowermost one of the memory dies in the stack.

13. The memory device of claim 8 wherein the first bond wires are bonded only to the first front-end contacts of a lowermost one of the memory dies in the stack, and wherein the second bond wires are bonded only to the second front-end contacts of the lowermost one of the memory dies in the stack.

14. The memory device of claim 8 wherein the first and second front-end contacts of each memory die extend in a first row, wherein the first and second back-end contacts of each memory die extend in a second row, and wherein the axis is orthogonal to the first and second rows.

15. The memory device of claim 8 wherein each of the memory dies further comprise:
a first redistribution structure electrically coupling the first and second front-end contacts to the corresponding ones of the first and second back-end contacts; and
a second redistribution structure electrically coupling the first and second back-end contacts to the circuitry.

16. The memory device of claim 8, further comprising fourth bond wires bonded to and extending between the first back-end contacts of at least one adjacent pair of the memory dies in the stack.

17. The memory device of claim 8 wherein the plurality of memories includes at least four memories.

18. The memory device of claim 8, further comprising a package substrate, wherein the memory dies are arranged in the stack on the package substrate, wherein the package substrate includes first package contacts and second package contacts, wherein the first bond wires are bonded to and extend between the first package contacts and the first front-end contacts of the at least one of the memory dies, and wherein the second bond wires are bonded to and extend between the second package contacts and the second front-end contacts of the at least one of the memory dies.

19. A memory device, comprising:
a primary memory die;
a secondary memory die stacked on the primary memory die, wherein the primary memory die and the secondary memory die each comprise—
a substrate including circuitry;
first back-end contacts electrically coupled to the circuitry;
second back-end contacts electrically coupled to the circuitry;
first front-end contacts, wherein individual ones of the first front-end contacts are electrically coupled to and aligned along an axis with corresponding ones of the first back-end contacts; and second front-end contacts, wherein individual ones of the second front-end contacts are electrically coupled to corresponding ones of the second back-end contacts; and first bond wires bonded to the first front-end contacts the primary memory die, wherein the first bond wires are configured to receive power and/or ground signals from an external device via a front-end interface;

second bond wires bonded to the second front-end contacts of the primary memory die, wherein the second bond wires are configured to receive data signals from the external device via the front-end interface; and third bond wires bonded to and extending between the second back-end contacts of the primary memory die and the secondary memory die.

* * * * *